(12) United States Patent
Koley et al.

(10) Patent No.: US 6,339,496 B1
(45) Date of Patent: *Jan. 15, 2002

(54) CAVITY-LESS VERTICAL SEMICONDUCTOR OPTICAL AMPLIFIER

(75) Inventors: Bikash Koley, College Park; Mario Dagenais, Chevy Chase, both of MD (US)

(73) Assignee: University of Maryland, Riverdale, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/599,428

(22) Filed: Jun. 22, 2000

Related U.S. Application Data
(60) Provisional application No. 60/140,388, filed on Jun. 22, 1999.

(51) Int. Cl.$^7$ .............................................. H01S 3/0933
(52) U.S. Cl. ........................................ 359/344; 438/22
(58) Field of Search ........................... 359/344; 257/184, 257/185, 189, 458, 12, 21, 656, 335, 328, 183, 191, 200

(56) References Cited

U.S. PATENT DOCUMENTS

| | | | |
|---|---|---|---|
| 4,075,654 A | * 2/1978 | Hara | 357/30 |
| 4,660,207 A | * 4/1987 | Svilans | 372/45 |
| 5,038,356 A | * 8/1991 | Botez | 372/45 |
| 5,040,033 A | * 8/1991 | Dutta | 357/19 |
| 6,061,381 A | 5/2000 | Adams et al. | |
| 6,064,683 A | 5/2000 | Johnson | |
| 6,067,307 A | 5/2000 | Krishnamoorthy | |
| 6,069,905 A | 5/2000 | Davis et al. | |
| 6,069,908 A | 5/2000 | Yuen et al. | |

OTHER PUBLICATIONS

Wang, Y. et al. "Theoretical Analysis of Confined Quantum State GaAs/AlGaAs Solid–State Photomultipliers." IEEE J. of Quantum Mech., vol. 26, No. 2, Feb. 1990. pp. 285–295.*
Someya, Y. et al. "Two–Dimensional Analysis o fthe Surface Recombination Effect on Current Gain for GaAlAs/GaAs HBT's." IEEE Trans. Elect. Devices, vol. 35, No. 7, Jul. 1988.*

(List continued on next page.)

Primary Examiner—Thomas H. Tarcza
Assistant Examiner—Andrew R. Sommer
(74) Attorney, Agent, or Firm—Rosenberg, Klein & Lee

(57) ABSTRACT

A cavity-less vertical semiconductor optical amplifier is provided which includes an active region of an intrinsic bulk semiconductor material sandwiched between p- and n-layers of semiconductor materials in which a vertical gain channel of a predetermined confined cross-sectional configuration is formed to constitute an amplification region of the optical amplifier. The amplification region is sandwiched between layers of p- and n-doped layers of linearly graded semiconductor material supplying holes and electrons to the active region upon switching "ON" of the optical amplifier. Several factors contribute to substantial amplification of an optical signal at a relatively low injection current which include a relatively long active region allowing sufficient single pass gain as well as a strictly confined cross-sectional configuration of the vertical gain channel which reduces the active volume of the amplification region resulting in substantially high gain at a relatively low current. Flattening of the conduction band and valence band profiles allows easy access of the holes and electrons into the active region. The cavity-less vertical semiconductor optical amplifier of the present invention is intended for multidimensional architectural structures for high speed communication.

29 Claims, 6 Drawing Sheets

OTHER PUBLICATIONS

Holtman, C. "Integration and Applications of III–V Semiconductor Optical Amplifiers." ECOC '98 Sep. 2–24, 1998. pp. 499–500.*

C. Tombling, et al., Performance Predictions for Vertical–Cavity Semiconductor Laser Amplifiers, IEEE J. of Quantum Electroncis, vol. 30, No. 11, Nov. 1994, pp. 2491–2498.

D. Wiedenmann, et al. "Performance Characteristics of Vertical–Cavity Semiconductor Laser Amplifiers," Electronics Letters Online No. 19960236.

D. Wiedenmann, et al., "Oxide–Confined Vertical–Cavity Semiconductor Optical Amplifier for 980–nm Wavelength," Lasers and Electro–Optics, 1998, CLEO98, Summaries of Papers Presented at the Conference, 1998, CThM5, pp. 378–379.

S.F. Lim, et al., A Proposal of Broad Bandwidth Vertical–Cavity Laser Amplifier, LEOS '95 Annual Meeting, 109.3, 1995, pp. 307–308.

C.W. Corzine, et al., "Design of Fabry–Perot Surface–Emitting Lasers with a Periodic Gain Structure," IEEE J. of Quantum Electronics, vol. 25, No. 6, Jun. 1989, pp. 1513–1524.

K.J. Ebeling, et al., "Diode Cascade Quantum Well VCSEL," LEOS Summer Topical Meeting 1997, WBI, 1997, pp. 61–62.

Y. Kotaki, et al., "GaInAsP/InP Surface Emitting Laser with Two Active Layers," 16th Int. Conf. Sol. State Devices and Materials, Kobe, 1984, pp. 133–136.

* cited by examiner

OPERATED WITH NEIGHBORHOOD OPERATOR

ORIGINAL IMAGE

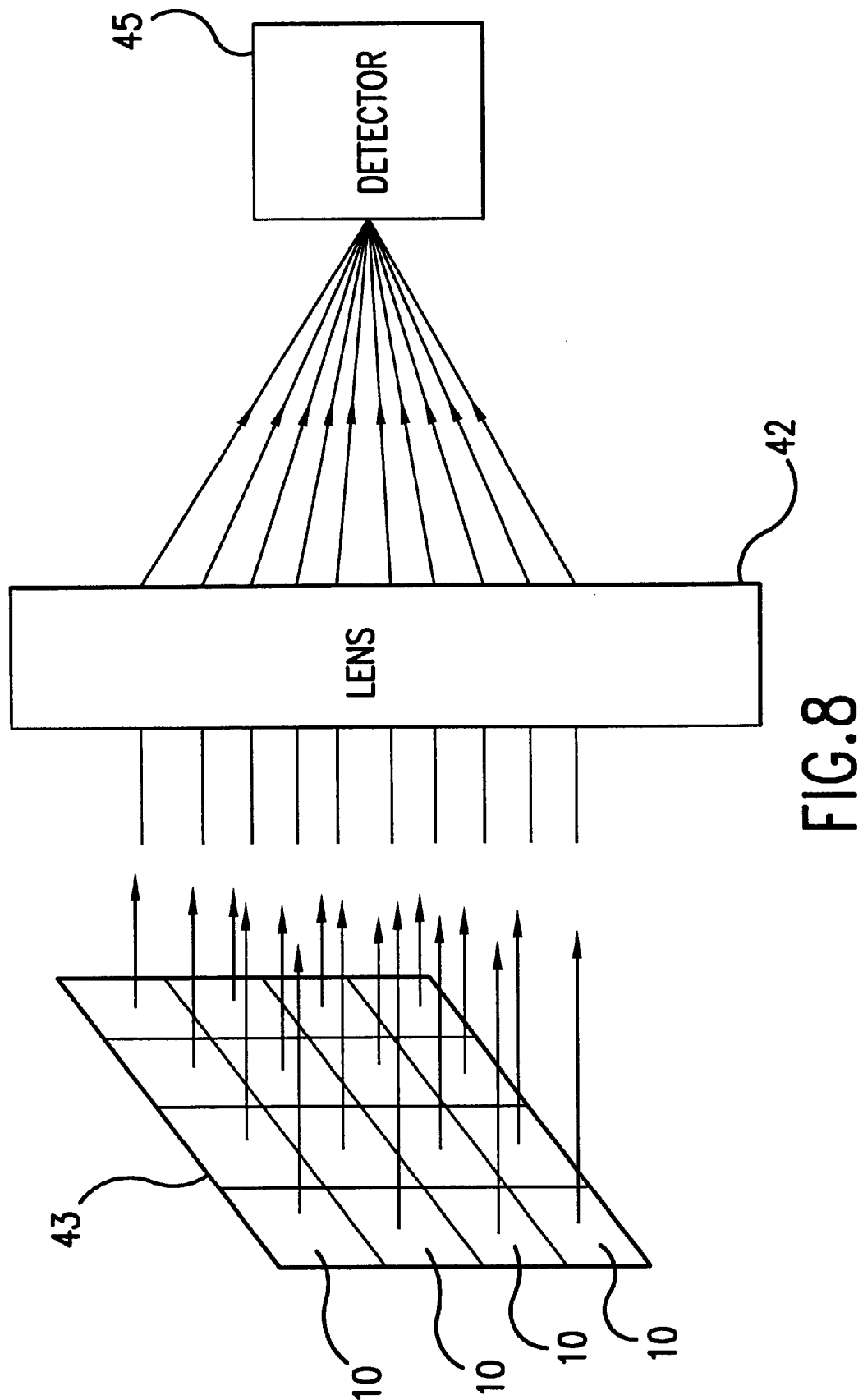

CAVITY-LESS VERTICAL SEMICONDUCTOR OPTICAL AMPLIFIER

REFERENCE TO RELATED APPLICATION

This patent application is based upon U.S. Provisional Patent Application Serial No. 60/140,388, filed on Jun. 22, 1999.

FIELD OF THE INVENTION

The present invention relates to the field of semiconductor optical amplifiers and more particularly, to vertically arranged semiconductor structures for amplification of an optical signal where resonant cavities are avoided, which are free of the disadvantages imposed by prior art cavity amplifying structures.

Particularly, the present invention relates to a cavity-less vertical semiconductor optical amplifier which has a broad transmission bandwidth and uses a relatively low injection current for amplification of an optical signal.

Further, the present invention relates to a cavity-less vertical semiconductor optical amplifier based on Periodic Table groups III–V or II–VI material system which includes a relatively thick layer of intrinsic semiconductor material sandwiched between p-doped and n-doped layers of semiconductor materials for amplification of an input optical signal within a strictly confined vertical gain channel extending through a created p-i-n structure. In this manner, a directed flow of p- and n-type carriers is obtained in the active region within the confined cross-section of the vertical gain channel. Additionally, substantial carrier concentration, as well as high current density is achieved within the active region which contributes to amplification of an input optical signal.

Further, the present invention relates to a cavity-less vertical semiconductor optical amplifier which may be arranged into multidimensional architectural structures to form an optical cross-bar switch, spatial light modulator with gain, optical boundary detection device, optical OR gate, and other optical mechanisms.

Still further, the present invention relates to a technological process of manufacturing a cavity-less semiconductor optical amplifier.

BACKGROUND OF THE INVENTION

Optical communication has emerged as one of the most powerful driving forces in present digital systems. The increasing demand for wider bandwidth and the quest for speedier transmission have led to extensive deployment of optical fiber networks for data and voice communications and the concept of parallel optical architecture. As a result, vertical cavity surface emitting lasers (VCSEL) are being actively researched and are used in this type of parallel optical architecture.

PRIOR ART

Vertical cavity surface emitting lasers are explicitedly described in U.S. Pat. Nos. 6,061,381, 6,064,683, 6,067,307, 6,069,905, and 6,069,908. Generally, VCSELs include a resonant cavity formed between top and bottom distributed Bragg reflectors. The resonant cavity contains an active region composed of a bulk semiconductor layer or one or more quantum well layers which are interleaved with barrier layers. On opposite sides of the active regions are mirror stacks (Bragg reflectors) which are formed by interleaved semiconductor layers having properties, such that each layer is typically a quarter wavelength thick at the wavelength of interest thereby forming the mirrors for the laser cavity. Generally there are opposite conductivity type regions on opposite sides of the active region and the laser is turned on and off by passing the current through the active region.

Problems have arisen in that these prior art devices operate typically in either a transmission mode or a reflection mode. Such prior art devices suffer from a narrow gain band width due to the physics of the vertical cavity surface emitting laser using distributed Bragg reflector mirrors. In order to compensate for the small single pass gain in a typical cavity multiple quantum well gain region, multiple recirculation of the light beam within the resonant cavity is needed. Thus a high Q cavity is needed which is obtained by growing thick distributed Bragg reflectors mirrors on both sides of the cavity. These mirrors are wavelength selective which means that they reflect the light recirculating within the resonant cavity over a very narrow band of wavelength.

By reducing the number of Bragg reflector mirrors on both sides of the cavity it is possible to slightly broaden the bandwidth of the vertical cavity surface emitting lasers however, this approach leads to formation of a "clumsy" and low gain amplifier which still fails to provide operation in sufficient bandwidth spectrum.

As shown in FIG. 1, a transmission spectrum for a vertical cavity surface emitting laser amplifier having twenty periods of $Al_{0.7} Ga_{0.3} As/Al_{0.1} Ga_{0.9}As$ mirrors on both sides of the resonant cavity has a very narrow bandwidth at 850 nm of the bandwidth spectrum. These narrow bandwidths of gain of typical vertical cavity surface emitting lasers are not sufficient for spatially-parallel optical communication applications.

It is thus desirable to have a vertical optical amplifier capable of providing much broader bandwidths gain than a typical vertical cavity surface emitting laser, and which would be capable of being turned on and off in a nanosecond time scale.

SUMMARY OF THE INVENTION

It is therefore an object of the present invention to provide a vertical semiconductor optical amplifier having the gain bandwidth which is several hundred times higher than that of typical vertical cavity surface emitting lasers, and which would be well suited for multi-dimensional interconnects for optical signal processing in a nanosecond time scale. Additionally, it is an object to provide an optical amplifier which may be used for large parallel interconnect, two dimensional optical signal processing and for implementing a free-space cross connect switch.

It is a further object of the present invention to provide a cavity-less vertical semiconductor optical amplifier, the physics of which does not rely on a resonant cavity sandwiched between distributed Bragg reflector mirrors for amplification of the optical signal.

It is still another object of the present invention to provide a cavity-less vertical semiconductor optical amplifier in which amplification of the signal is achieved in a vertical gain channel of a predetermined confined cross-sectional configuration which includes a p-i-n structure having an active regions of a thick layer of an intrinsic semiconductor material sandwiched between p-doped and n-doped layers of semiconductor materials. This results in a flow of p- and n-type carriers into the active region being confined within the very narrow cross-sectional configuration of the gain channel and results in formation of a substantial carrier concentration, as well as current density within the active region, thus contributing to amplification of an input optical signal.

It is an object of the present invention to provide a cavity-less semiconductor optical amplifier using a thick active region of an intrinsic semiconductor material in combination with confining the injected current over very narrow volume within the thick active region, i.e., to provide an amplification structure having a substantial length for high single pass gain in conjunction with a smaller active volume to lessening the injected current needed to obtain gain of the signal. In this manner, the optimization of performance and operational parameters of the cavity-less semiconductor optical amplifier is obtained.

It is another object of the present invention to provide a method of manufacturing a cavity-less semiconductor optical amplifier which has a wide bandwidth gain and optimized performance and operational parameters.

According to the teaching of the present invention, a cavity-less semiconductor optical amplifier comprises a vertical gain channel of a predetermined confined cross-sectional configuration which includes a p-i-n structure including an active region (thick layer of an intrinsic semiconductor material) sandwiched between a layer of a p-doped semiconductor material on one surface of the active region and a layer of an n-doped semiconductor material on an opposite surface of the active region.

A pair of partially oxidized layers sandwiches the p-i-n structure therebetween. Each of these partially oxidized layers has a current injection path formed therein and arranged in vertically aligned relationship each to the other, thus defining the confined cross-sectional configuration of the gain channel.

The optical amplifier of the present invention also includes a top structural arrangement spaced from the p-i-n structure through one of the partially oxidized layers. Preferably the top structural arrangement includes a p-doped linearly graded layer made of p-type semiconductor material disposed in intimate contact with the top partially oxidized layer, a cap layer formed of p-type semiconductor material positioned on the top of the p-doped linearly graded layer, an anti-reflection area formed in the center of the top of the cap layer, and a contact surface formed on the top of the cap layer and surrounding the anti-reflection area thereon.

The cavity-less semiconductor optical amplifier further includes a bottom structural arrangement spaced from the p-i-n structure through another partially oxidized layer. Preferably the bottom structural arrangement includes a shoulder region layer formed of n-doped semiconductor material disposed in intimate contact with another partially oxidized layer, an etch-stop layer formed of a semiconductor material positioned on the bottom of the shoulder region layer, a n-doped linearly graded layer formed of an n-type semiconductor material positioned on the bottom of the etch-stopped layer, and a substrate supporting the n-doped linearly graded layer thereon. An aperture is etched within the substrate and the n-doped linearly graded layer to form an output window for the output optical signal. An anti-reflection area is formed at the bottom of the etch-stop layer within peripherals of the output window, and another contact surface is formed on the bottom of the substrate.

The thickness of the active region is preferably in the order of 1.0–1.2 micron which is generally thick enough to provide a high single pass gain for the light.

The whole structure may be built on the basis of either III–V or II–VI material systems.

The thicknesses of each layer within the cavity-less vertical semiconductor optical amplifier of the present invention as well as specifics of the linearly graded layers are chosen to provide ease of access of the p- and n-type carriers into the active region in order to form a high concentration of the carriers within the laterally confined vertical gain channel. The cross-sectional diameter of the gain channel is preferred to be not greater than 5 microns. The dimensions of the current injection path within the partially oxidized layers are obtained by controlled selective etching of the partially oxidized layers from peripherals thereof towards the center at controlled conditions and during predetermined time periods.

The cavity-less vertical semiconductor optical amplifier as previously described may be arranged in multi-dimensional architectural structures to form optical cross-bar switches, spatial light modulator with gain, optical boundary detection apparatuses, optoelectronic OR gates, as well as a number of other optical elements.

The present invention includes a method of manufacturing a cavity-less semiconductor optical amplifier which includes the steps of:

growing a linearly graded n-doped layer of AlGaAs of 0.1 micron thickness with concentration of Al gradually changing along the thickness of the layer on the surface of n-GaAs substrate;

depositing an etch-stop AlGaAs layer with approximately 80% content of Al on the top of the linearly graded n-doped layer;

forming on the top of the etch-stop layer an n-doped AlGaAs shoulder region of 0.2 micron thickness with approximately 70% Al content;

growing an n-doped AlAs layer of approximately 0.1 micron thickness on the top of the n-doped AlGaAs shoulder region layer;

positioning an n-doped AlGaAs shoulder layer on the top of the n-doped AlAs layer;

forming a bulk intrinsic GaAs active region of 1.0–1.2 micron thickness on the top of the n-doped shoulder layer;

growing a p-doped AlGaAs shoulder layer on the top of the active region;

forming a p-doped AlAs layer of approximately 0.1 micron thickness on the top of the p-doped shoulder layer;

positioning a p-doped linearly graded AlGaAs layer of approximately 0.1 micron thickness with concentration of Al gradually changing along the thickness thereof;

depositing a p-doped GaAs cap layer of approximately 200 Angstrom thickness on the top of the p-doped linearly graded layer;

etching the layers formed above the n-doped AlGaAs shoulder region layer from the sides thereof, thus forming a cylindrical mesa and exposing from the sides thereof said p-doped and n-doped AlAs layers;

selectively oxidizing the p-doped and n-doped AlAs layers from the peripherals towards the center, thereby defining an injected current path at the centers of the p-doped and n-doped AlAs layers;

etching through the substrate since the substrate is not transparent and the n-doped linearly graded AlGaAs layer to form an output window below the cylindrical mesa;

passivating the cylindrical mesa at the sides thereof;

forming anti-reflection areas on the top of the cap layer and at the bottom of the etch-stop layer within the boundaries of the output window; and forming contacts on the top of said cap layer, top of the passivation structure and the bottom of the substrate.

The present invention is a cavity-less vertical semiconductor optical amplifier which, due to its specific structure and the use of a unique approach to the physics of the amplification of an optical signal is free of the disadvantages of prior art vertical cavity surface emitting lasers. The subject amplifier provides a much higher bandwidth gain than that of vertical cavity surface emitting lasers, and due to its two dimensional geometry is well suited for large parallel interconnect, two dimensional optical signal processing in a nanosecond time scale, and for implementing a free-space cross-connect switch or a spatial modulator with gain as well as other multi-dimensional architectural structures.

These and other novel features and advantages of this invention will be fully understood from the following detailed description of the accompanying drawings.

DESCRIPTION OF THE PREFERRED EMBODIMENTS

Figure 2:
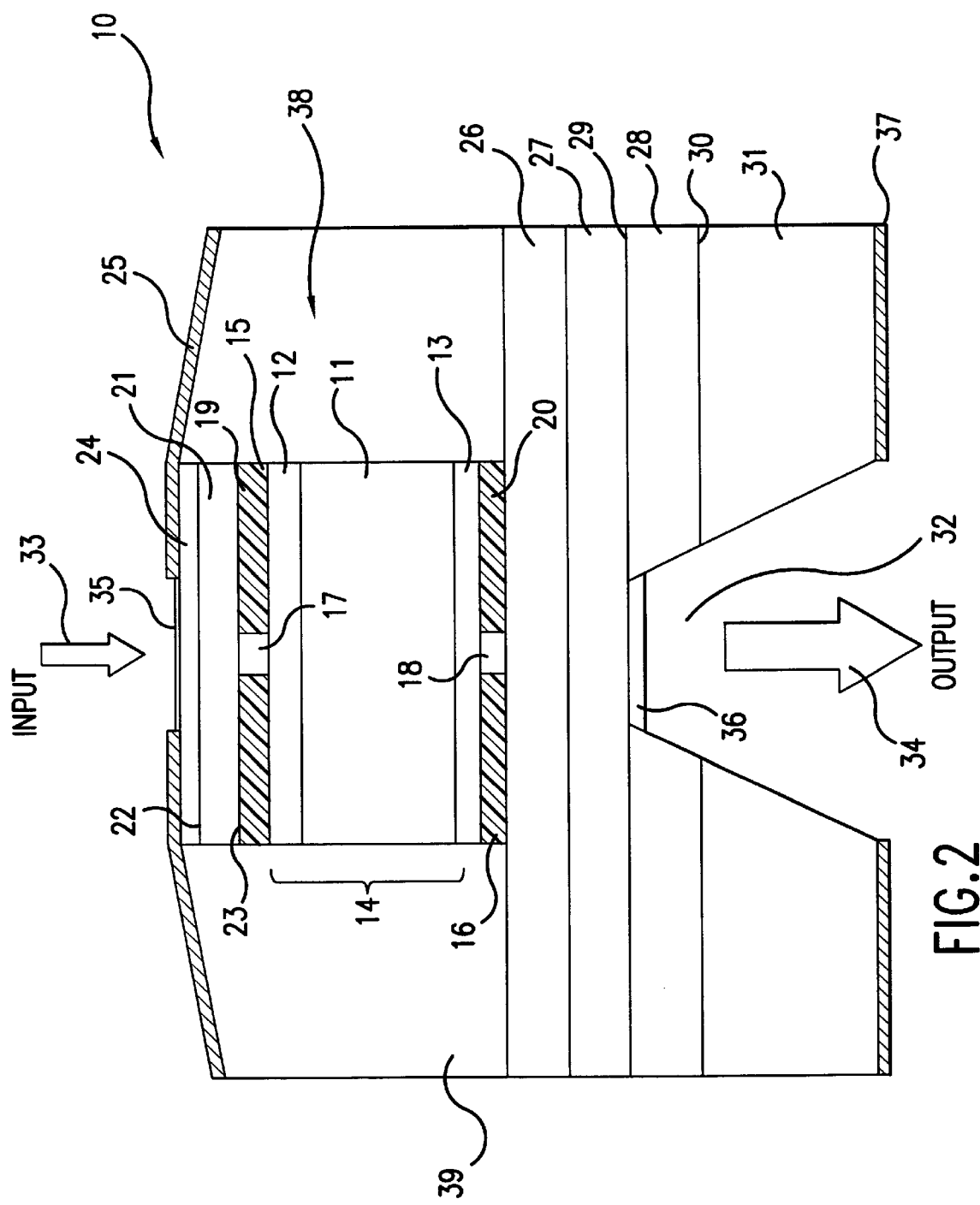
FIG. 2 is a cross-sectional schematic of the cavity-less vertical semiconductor optical amplifier structure of the present invention.

Referring to FIG. 2, a cavity-less semiconductor optical amplifier 10 is shown which includes active region 11 having a thick layer (the thickness being in the order of 1.0–1.2 micron) formed of bulk intrinsic GaAs semiconductor material. The active region 11 is sandwiched between a p-doped AlGaAs shoulder layer 12 on the top of the active region 11 and an n-doped AlGaAs shoulder layer 13 on the bottom of the active region 11. Together, the active region 11 and the p- and n-doped AlGaAs shoulder layers 12 and 13 form a p-i-n structure which mainly contributes to the amplification of a signal introduced into the amplifier 10. The shoulder layers 12 and 13 have approximately a 70% Al concentration. The layers are provided on both surfaces of the active region 11 in order to form a heterojunction on the boundaries between the p-doped shoulder layer 12 and active region 11 as well as between the n-doped shoulder layer 13 and the active region 11. By doping the shoulder layers 12 and 13 with Al, a larger band gap is obtained so that the intrinsic semiconductor (in this case GaAs) of the active region 11 having a narrower band gap is sandwiched between two semiconductor layers having a larger band gap. This provides for carrier confinement within the active region 11.

When the amplifier 10 is turned ON by a properly directed injection current, the p-type current composed mainly of holes, flows in the direction from the shoulder 12 to the active region 11, and n-type current composed mainly of electrons flows from the shoulder layer 13 to the active region 11. The electrons and holes pile up in the active region 11 and are confined therein by heterojunctions created at the interfaces between the shoulder layer 12 and active region 11 as well as between the shoulder layer 13 and the active region 11.

The concentration of the electron and holes within the active region 11 increases to the point where it is sufficient to obtain gain of a optical signal within the amplifier 10. Light travel within the active region 11 in a direction from the top thereof (shoulder layer 12) towards the bottom of the active region 11 (shoulder layer 13). The light covers a length equal to the thickness of the active region 11 which is large enough (1.0–1.2 micron) to provide optimal opportunities for the a single pass gain of the signal.

During the advancement of the light within the active region, the gain process takes place due to spontaneous and stimulated emission via the recombination of electrons and holes within the active region 11. This is a process known to those skilled in the art and includes generation of photons which are stimulated by the photons of the input light signal which enters the optical amplifier 10 (stimulated emission).

Additionally, during passage of the light signal through the active region, the carriers (the holes and electrons) recombine, thus producing a photon at each recombination. The recombination of the holes and the electrons may be either spontaneous or stimulated, i.e. caused by the photons of the input light signal. Due to the high concentration of the carriers of both signs in the active region 11, the quantity of emitted photons is sufficiently high and increases due to stimulated emission caused by the photons of the input light signal as well as by secondary emitted (recombination) photons. The aforementioned process takes place throughout the entire thickness of the active region 11 which is chosen to be lengthy enough to provide a substantial single pass gain.

However, in the structure of the optical amplifier 10 of the present invention gain is not only obtained by the large thickness of the active region 11 and confinement of the carriers within the active region 11 by heterojunctions created between the shoulder layer 12 and the active region 11 and the shoulder layer 13 and the active region 11. Gain is also provided by a unique design of the structure of the present invention so that a vertical gain channel of a predetermined confined cross-sectional configuration is formed in order to limit a volume of the active region which is activated by injected current (while maintaining the length of the active region 11 lengthy enough to obtain a substantial single pass gain).

In order to confine an amplification region in the lateral direction, a pair of partially oxidized layers 15 and 16 respectively formed of p-doped and n-doped AlAs semiconductor material of 0.1 micron thickness each, are positioned on the top of the p-doped AlGaAs shoulder layer 12 and on the bottom of the n-doped AlGaAs shoulder layer 13.

These two layers 15 and 16 are symmetrical with relation to the p-i-n structure 14 and are partially oxidized (as will be described in detailed further herein) to define unoxidized regions 17 and 18 surrounded by oxidized ($Al_xO_y$) areas 19 and 20, as best shown in FIG. 2. The diameter of each unoxidized region 17 and 18 (which serves as a current injection path formed within the top and bottom partially oxidized layers 15 and 16) is preferably approximately 5 microns. As can be seen, the current injection paths 17 and 18 are vertically aligned each with the other in order to define a vertical gain channel through the p-i-n structure 14.

By confining the lateral configuration of the vertical gain channel to the 5 micron diameter, the structure of the present invention enjoys a limited volume of the amplification region and sufficient length of the vertical gain channel to obtain high gain. In this manner, due to lateral confinement, a relatively low current is needed to be injected into the optical amplifier 10 to obtain needed gain as opposed to a high current which would be needed to activate the active region 11 if a confined laterally vertical gain channel is not formed.

As will be described further herein, an injection current of 10 mA is sufficient to obtain a high gain in the cavity-less semiconductor optical amplifier 10 of the present invention.

On the top of the partially oxidized layer 15, a p-doped linearly graded layer 21 formed of AlGaAs is located having 0.1 micron thickness with gradually changing Al concentration over the width of the layer 21. The material transforms from GaAs at the top surface 22 thereof to AlAs at the bottom surface 23 which is in intimate contact with the partially oxidized layer 15, i.e., the content of aluminum changes over the 0.1 microns thickness of the layer 21 from 0% (at the surface 22 or the layer 21) to 100% (at the surface 23 of the layer 21). The function of the p-doped linearly graded AlGaAs layer 21 is to contribute p-carriers, i.e., holes, into the overall flow of the carriers into the active region. The gradual change of the aluminum concentration over the thickness of the layer 21 allows a flattening of the valence band profile at the p-side of the amplifier 10 to ease the holes flow into the active region 11 as will be further discussed with regard to FIG. 3.

On the top of the p-doped linearly graded layer 21, a p-doped gallium arsenide (GaAs) cap layer 24 is formed having a thickness of approximately 200 Angstrom. The function of the cap layer 24 is to make the contact with a metal layer 25 through which the amplifier 10 is activated-deactivated by controlling the current injected into the optical amplifier 10. The cap layer 24 is made extremely thin (200 Angstrom) in order to decrease (or eliminate) absorption of the incoming light signal within the cap layer 24 and thus to allow passage of substantially the entire incoming light to the bulk active region 11.

Below the partially oxidized n-doped aluminum arsenide layer 16, an n-doped aluminum gallium arsenide (n-AlGaAs) shoulder region 26 is formed having a thickness of 0.2 microns with approximately 70% concentration of aluminum therein. The shoulder region layer 26 serves as a source of n-carriers, i.e., electrons, mostly contributing into the flow of the n-carriers into the bulk active region 11.

Beneath the n-doped AlGaAs shoulder region layer 26, an etch-stop layer 27 is formed which is formed of AlGaAs having approximately 80% concentration of aluminum therein. The composition of the etch-stop layer 27 is selected to provide termination of an etch process (to be discussed in detail in further paragraphs.) once the etching chemical (for example, acid) approaches the etch-stop layer 27.

Below the etch-stop layer 27, an n-doped linearly graded AlGaAs layer 28 is formed in which a content of aluminum changes from 80% at the surface 29 of the layer 28 to 0% at the surface 30 thereof. Thus, the composition of the n-doped AlGaAs linearly graded layer 28 changes from GaAs at the surface 30 to AlAs at the surface 29. Along with the n-doped AlGaAs shoulder region layer 26, the n-doped AlGaAs linearly graded layer 28 serves as a source of electrons contributing in the overall flow of the carriers into the active region 11.

Similar to the p-type linearly graded AlGaAs layer 21, the grading in the layer 28 smooths the carriers pass into the active region. As will be further discussed in detail with respect to the FIG. 3, since the conduction band profile of the n-side of the amplifier 10 is substantially flattened by the linear grading of the layer 28 the flow of the electrons is facilitated into the active region 11 from the layer 28.

The multilayer structure of the amplifier 10 is supported on a n-GaAs substrate 31 of approximately 150 micron thickness. Due to the high width of the substrate and because of the similar composition of the material of the substrate with respect to the composition of the material of the active region 11, the output light may be substantially absorbed within the material of the substrate 11. In order to eliminate or substantially decrease such an absorption, and to allow substantially the entire amplified output light to exit the optical amplifier 10, an output aperture 32 is formed through the substrate 31 and the n-doped AlGaAs linearly graded layer 28. In this manner, the output light avoids traveling through the substrate 31 where it otherwise would be absorbed.

The output aperture 32 is formed by etching through the substrate 31 and the layer 28 (as will be discussed in detail in further paragraphs). As shown in FIG. 2, the output aperture is positioned in vertical alignment with the vertical gain channel where amplification of the optical signal 33 takes place to provide the amplified output signal 34 with the shortest passage from the optical amplifier 10 through the output aperture 32.

Anti-reflection coating is deposited on the top of the cap layer 24, (forming an anti-reflection area 35) and on the bottom of the etch-stop layer 27 within the boundaries of the output aperture 32, (forming an anti-reflection area 36).

The bottom of the substrate 31 left after the formation of the output aperture 32 is covered with metal layer 37, thus forming a n-contact for the optical amplifier 10 which in conjunction with the p-contact 25 serves as an activation-deactivation mechanism for the amplifier 10.

The multilayered structure of the optical amplifier 10 of the present invention is formed by using standard technological processes such as liquid-phase, local, molecular-beam, solid-phase, vapor-phase epitaxy, film deposition, ion-beam deposition, dry and wet etching, oxidation, passivation, metal deposition, etc. These processes are not discussed herein in detail as they are readily known to those skilled in the art and do not present a novel subject matter of the invention in question.

The overall technological process of the creation of the cavity-less semiconductor optical amplifier however is unique and includes the following technological steps:

(a) Forming a linearly graded n-doped layer of AlGaAs of 0.1 micron thickness 28 with gradually changing concentrations of aluminum on the n-doped GaAs substrate along the width of the layer 28;

(b) Depositing on the top of the linearly graded n-doped layer 28, an etch-stop AlGaAs layer with 80% content of aluminum;

(c) Forming on the top of the etch-stop layer 27 an n-doped AlGaAs shoulder region layer 26 of 0.2 micron thickness with a 70% content of aluminum;

(d) Forming on the top of the n-doped shoulder region layer 26 a n-doped AlAs layer 16 of 0.1 micron thickness;

(e) Forming on the top of the n-doped AlAs layer 16 a n-doped AlGaAs shoulder layer 13;

(f) Forming a bulk intrinsic GaAs active region 11 of 1.0–1.2 micron thickness on the top of the n-doped AlGaAs shoulder layer 16;

(g) Forming a p-doped AlGaAs shoulder layer 12 on the top of the active region 11;

(h) Forming a p-doped AlAs layer of 0.1 micron thickness of the top of the shoulder layer 12;

(i) Forming a p-doped linearly graded AlGaAs layer 21 of 0.1 micron thickness with concentration of aluminum gradually changing along the width thereof;

(j) Forming above said layer 21 a p-doped GaAs cap layer of 200 Å thickness;

(k) Dry etching the layers 16, 13, 11, 12, 15, 21, and 24, in sequence, from the sides towards the center thereof to form a cylindrical mesa 38 erecting above the n-doped AlGaAs layer 26;

(l) Wet oxidizing the mesa 38 at approximately 450 centigrade in $N_2$ gas flow saturated in water vapor to selectively oxidize the layers 15 and 16. The oxidation of these layers 15, 16 advances from the peripherals of the cylindrical mesa 38 towards the center thereof which define current apertures 17 and 18 (also referred to herein as current injection paths) on both sides of the p-i-n structure 14;

(m) Wet etching the substrate 31 and the n-doped AlGaAs linearly graded layer 28 to form the output aperture 32 extending completely through the substrate 31 and the layer 28. The etching stops at the etch-stop layer 27 due to 80% content of aluminum therein;

(n) Passivating the cylindrical mesa 38 so that passivation structure 39 is formed which is substantially the dielectric material covering the top surface of the layer 26 surrounding the cylindrical mesa 38;

(o) Forming annular contacts 25 and 37 on the top cap layer 24 and on the bottom of the substrate 31; and (p) Covering the top of the cap layer 24 and the etch-stop layer 29 within the boundaries of output aperture 32 with anti-reflection coating to prevent reflection of the input optical signal 33 and output optical signal 34 on the interface between air and semiconductor material.

The structure of the optical amplifier 10 of the present invention is not limited to the AlGaAs based material system since it is equally valid for both III–V and II–VI material systems. For example, using bulk InGaAsP active region lattice matched to InP, similar cavity-less semiconductor optical amplifier can be designed that operates at 1.3 micron or 1.55 micron wavelength and other wavelengths of significance.

In an alternative implementation, instead of thick bulk active region 11, periodic gain structures or an amplifying structure with more than one active layer may be used. The active region 11 may also contain several p-n regions in series each of which would contain an undoped multi-quantum well region. In this case, the layer separating two groups of quantum wells is a highly doped tunneling junction driven in a backward or reverse direction. Under forward bias, the tunnel junction breaks down and all the quantum well gain regions operate in series.

In system lattice matched to InP, selective oxidation of InAlAsP or AlSbAs can be used in the same manner as selective oxidation described in previous paragraphs. Alternatively, ion implantation to obtain current constriction or some lattice disordering techniques can be used.

Figure 3:
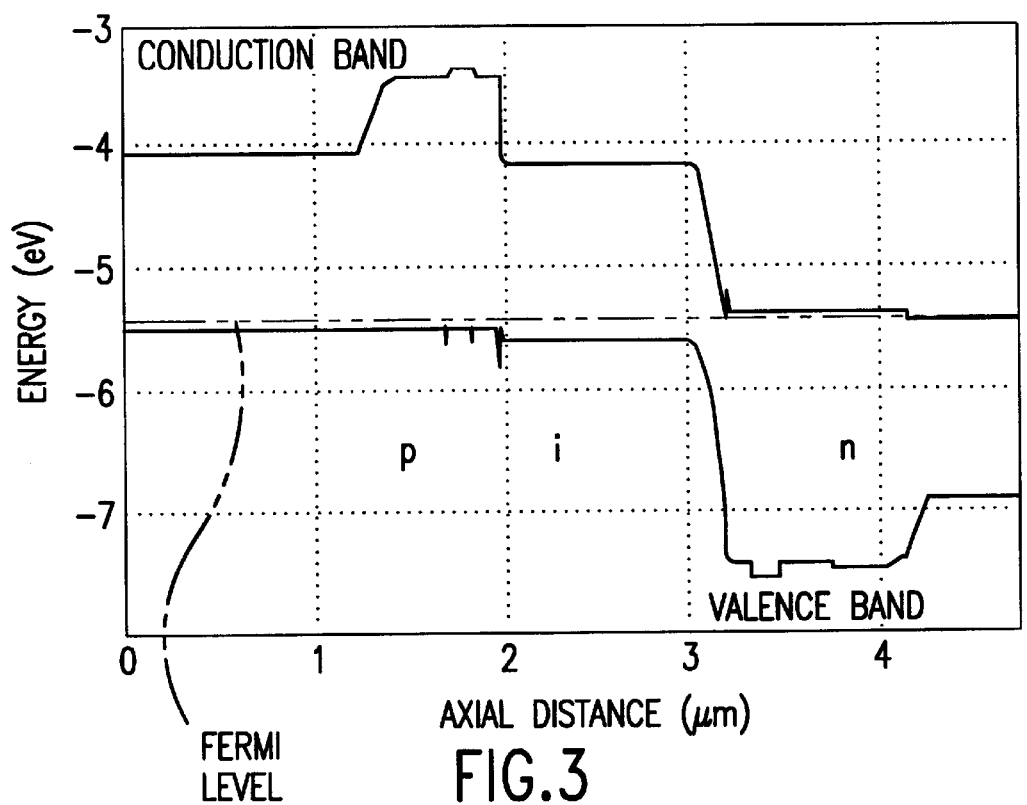
FIG. 3 is a graphical representation of calculated conduction band and valence band profiles for the cavity-less semiconductor optical amplifier structure of the present invention.

Several computer simulations with the proposed cavity-less vertical amplifier structure 10 have been carried out. As can be seen from FIG. 3, showing the calculated band profile for the GaAs based structure 10, the conduction band in the n-side and the valence band in the p-side are substantially flattened to allow electrons and holes to easily flow into the active region 11. As discussed in previous paragraphs, the flattened profile for the conduction band and the valence band is obtained by careful selection of the width of the layers of the structure 10 along with linearly grading the concentration of aluminum over the thickness of the p-doped and n-doped linearly graded layers 21 and 28.

Figure 4:
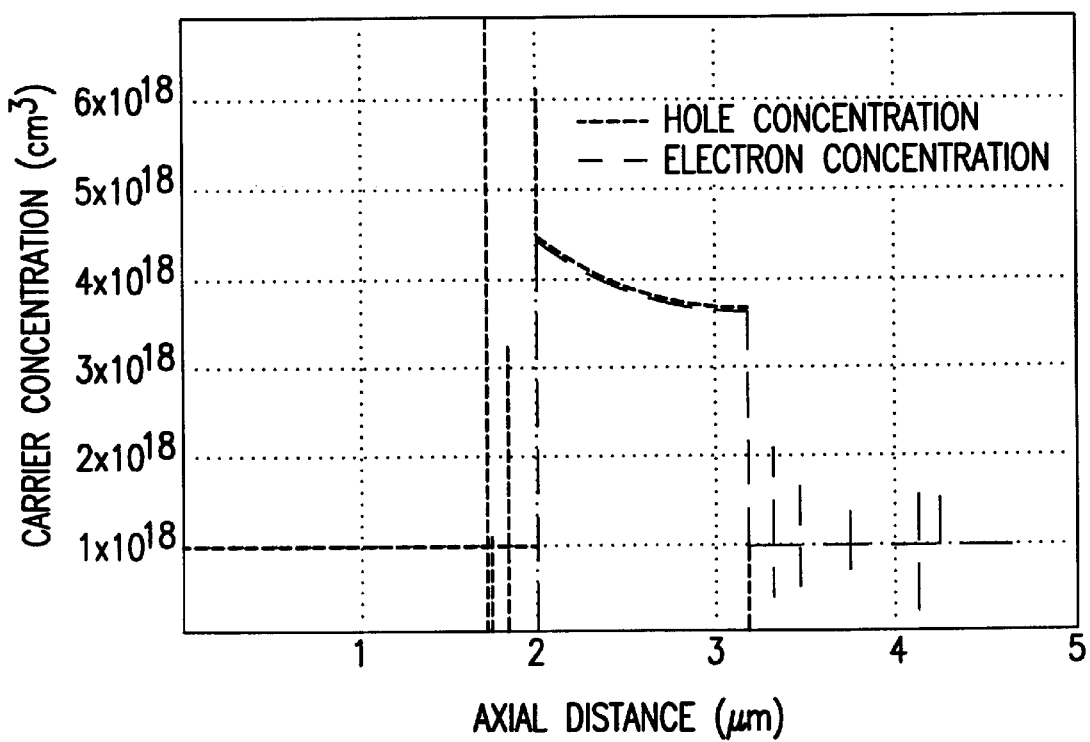
FIG. 4 is a graphical representation of a calculated carrier concentration profile in the cavity-less vertical semiconductor optical amplifier structure of the present invention.

With regard to FIG. 4, showing a simulated carrier density profile in the amplifier 10 for an injection current density of $4.8 \times 10^4$ Amp/cm$^2$, a carrier concentration of 4E18 cm$^{-3}$ is obtained in the active region 11. Since the current injected into the active region 11 is laterally confined within small apertures 17 and 18, defined by selectively oxidizing the layers 15 and 16 on both sides of the active region 11, a very high current density is achieved in the vertical gain region for relatively low injection current. For a 5 micron diameter current injection passage 17 and 18, a current density of $4.8 \times 10^4$ Amp/cm$^2$ in the active region 11 corresponds to an injection current of 10 mA.

Figure 1:
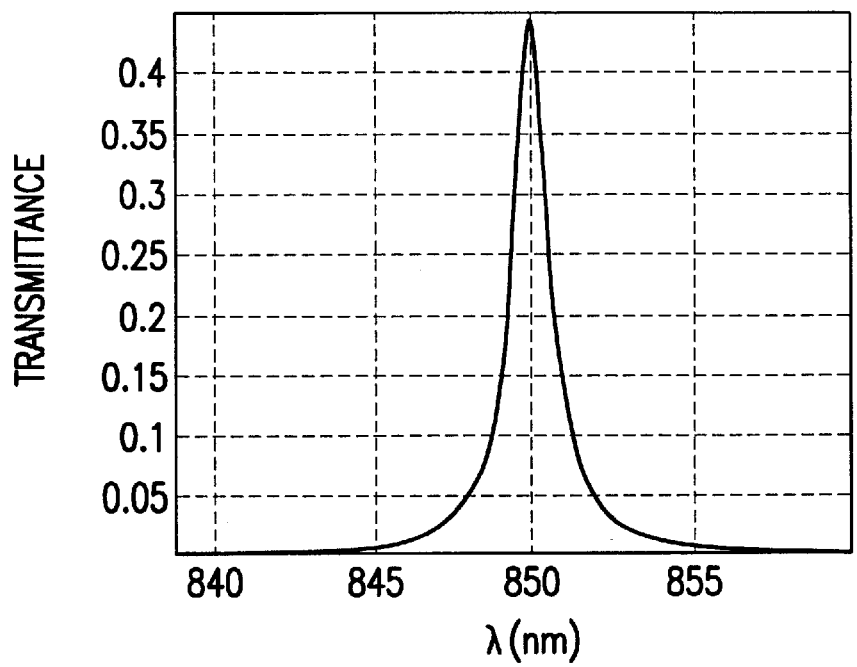
FIG. 1 is a graphical representation of transmitted spectrum of a conventional vertical cavity surface emitting laser amplifier of the prior art.
Figure 5:
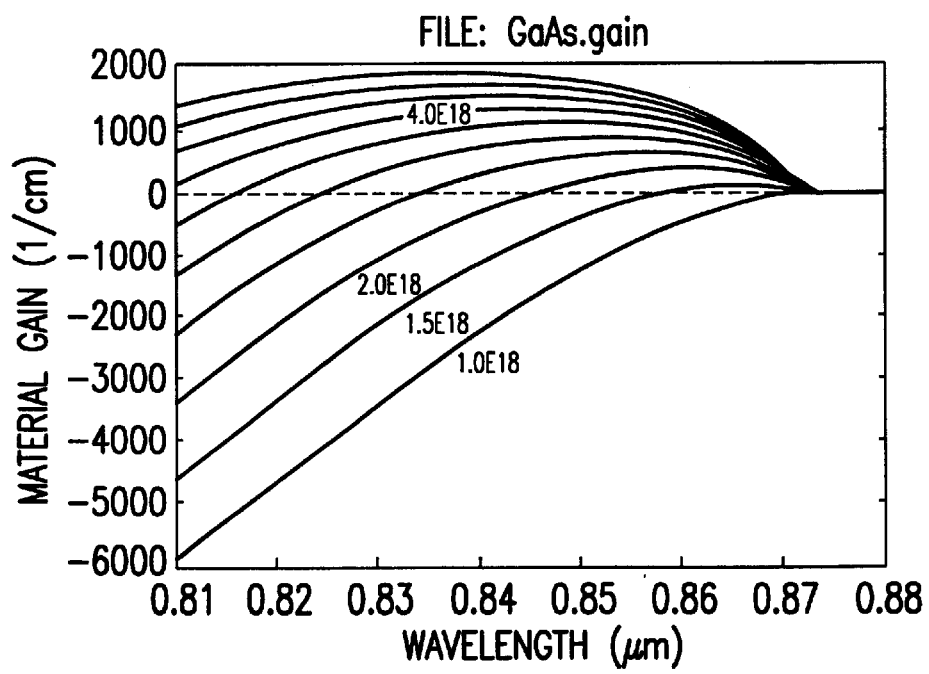
FIG. 5 is a diagram showing a gain spectrum of bulk GaAs active region at room temperature calculated for different injected carrier concentrations.

With regard to FIG. 5, representing the gain spectrum of bulk GaAs at room temperature calculated for different injected carrier concentrations, it is seen that for an injected carrier density of 4.0E18 cm$^{-3}$, peak gain is obtained for a broad spectrum of wavelengths which is larger than 1,000 cm$^{-1}$. This corresponds to a single pass gain of more than unity for a 1.2 micron thick active region 11.

The optical amplifier 10 is a perfect candidate for multi-dimensional structures, such as N×N cross bar switch, optical boundary detection architecture, OR gates, etc.

Figure 6A:
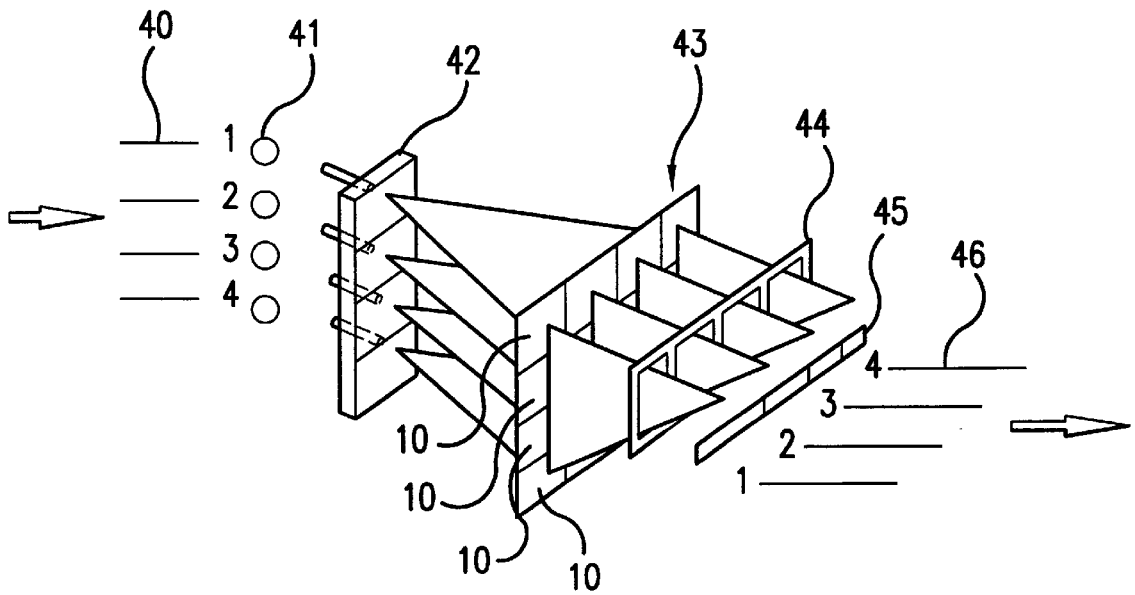
FIGS. 6A and 6B are schematic representations of operational principles of a 4×4 all optical crossbar switch using the cavity-less semiconductor optical amplifier of the present invention.
Figure 6B:
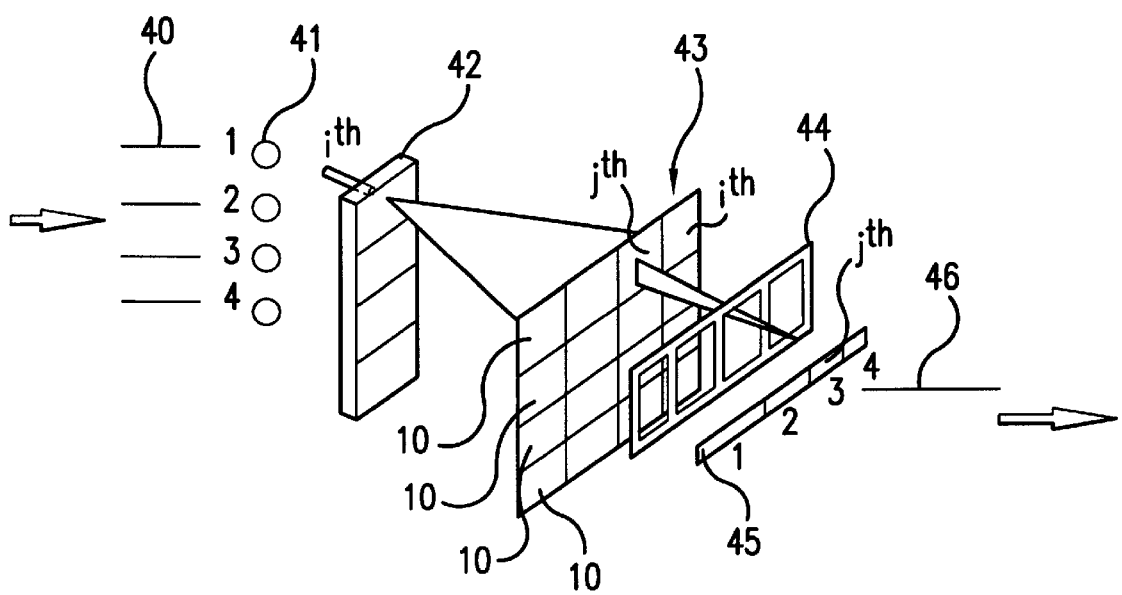

One of the applications of the optical amplifier 10 of the present invention is to implement a free-space all optical crossbar switching element using a N×N cavity-less vertical amplifier array along with a vertical cavity surface emitting lasers (VCSEL), MSM or other detector array and custom made lens array or defractive element. Such a switch architecture is shown in FIGS. 6A and 6B. Although the architecture shown is for N=4, it can be easily extended to any N.

As shown in FIG. 6, four input channels 40 drive four vertical cavity surface emitting lasers 41 using CMOS driver chip (not shown in the drawing). A vertical cylindrical lens array 42 (or any other suitably designed optical element including diffractive optics) fans light from each of the four vertical cavity surface emitting lasers 41 across a row of the cavity-less vertical amplifier array 43. A second array of horizontal cylindrical lens (or a defractive optical element with similar functionality) 44 focus the light from each column of the array 43 of the cavity-less vertical optical amplifiers 10 onto a detector in a detector row 45.

Thus, as best shown in FIG. 6B, if the $i^{th}$ input channel 40 is to be routed to the $j^{th}$ output channel, the $i^{th}$ VCSEL 41 in the row of 4 VCSELs will be driven. Light output of this $i^{th}$ VCSEL will be distributed to the entire $i^{th}$ row of the array 43 of the cavity-less vertical optical amplifiers 10 by the cylindrical lens array 42. Only the $(i,j)^{th}$ element of the array 43 will be turned "ON" for transmission. The transmitted light out the $i^{th}$ cavity-less vertical optical amplifier 10 will be collected by the second cylindrical lens array 44 and since it is coming out of the $j^{th}$ column of the array 43, the light will be focused on the $j^{th}$ detector. Thus, any of the four input channel 40 may be routed into any of the four output channels 46 in a non-blocking fashion.

Figure 7B:
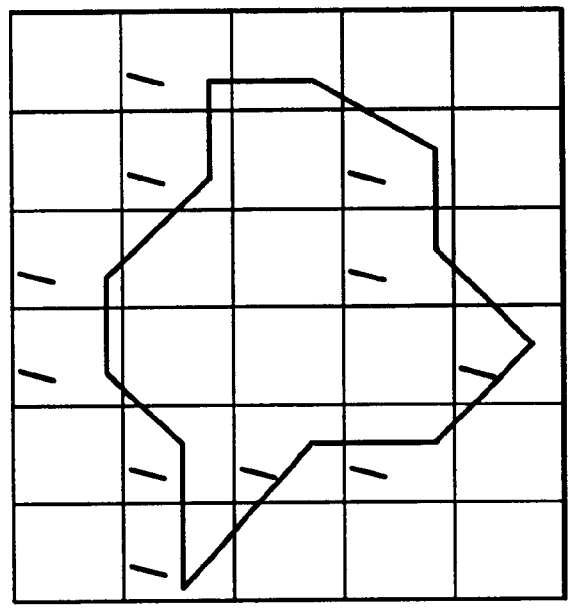
FIGS. 7A and 7B show diagrams illustrating a method of boundary detection using the architecture similar to that of FIGS. 6A and 6B; and, FIG. 8 is a schematic representation of implementation of an optical OR gate using the cavity-less semiconductor optical amplifiers of the present invention.
Figure 7A:
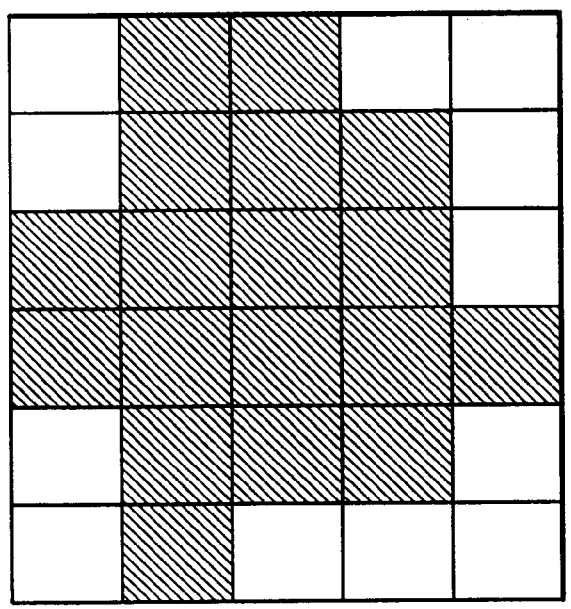

Similar architecture described in the previous paragraphs can be applied to optical boundary detection for a monochrome image, the technique of which is shown in FIGS. 7A and 7B. It is well known, that boundary detection can be accomplished by looking at the neighborhood of each pixel of the image. The known neighborhood operator is the matrix:

$$M = \begin{bmatrix} 0 & 1 & 0 \\ 1 & 1 & 1 \\ 0 & 1 & 0 \end{bmatrix}$$

For the boundary elements, at least one of the four neighboring pixels will be different from the original pixel. Thus, the matrix M has to be used as a mask, and one has to look for one different pixel out of the five detected pixels. This mask can be easily implemented using the cavity-less vertical-amplifier array of the present invention. The VSCEL array 41 of FIGS. 6A and 6B, is used as the source image, and the MSM detector array 45 is used to detect the image masked by the neighborhood operator implemented by the cavity-less vertical amplifiers (CLVA).

The M-matrix pattern is scanned electronically in the CLVA array 43. Thus, at every clock cycle, only 5 neighboring pixels pass through the CLVA array 43 and are detected by the MSM-detector array 45. The detector array output can be easily analyzed with simple logic circuits to look for at least one pixel different from the rest. If all the 5 pixels are similar (all '0's or all '1's), then that particular pixel is not at the boundary; otherwise, the original pixel is located at the boundary of the image.

It is possible to implement an optical OR gate to increase the processing speed or to use standard electrical logic gates for doing the same operation. It was previously noted that if the pixel is not in the boundary, then all the five pixels passing through the CLVA array will be either '0' or '1'. Looking at both the images and the inverted image shown in FIGS. 7A and 7B a detection of all '0's in either of the images for a particular pixel rules out that the particular pixel is at the boundary. If this condition is not satisfied, the pixel will be at the boundary.

Thus an optoelectronic 'OR' function is implemented for all the pixels and if the output is '0', all the pixels passing through the CLVA are zero. FIG. 8 shows the optoelectronic OR gate implemented with the CLVA 10 of the present invention for optical processing with very fast boundary-detection schemes for monochrome images, as opposed to electronic Matrix operation that involves large processing circuit and is slower. In this particular scheme, part of the processing is done optically, improving the performance of the border detection circuit.

As it is clear from the above disclosure, the structure of the novel cavity-less vertical semiconductor optical amplifier increases bandwidth gain, allows nanosecond time scale communication, and is well suited for large parallel interconnect and multidimensional optical signal processing.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular application of elements may be reversed or interposed, all without departing from the spirit or scope of the invention as defined in the appended claims.

What is claimed:

1. A cavity-less semiconductor optical amplifier, comprising:
   (a) a vertical gain channel having a predetermined confined cross-sectional configuration, said vertical gain channel including a p-i-n structure having an active region of an intrinsic semiconductor material sandwiched between a layer of a p-doped semiconductor material on a first surface of said active region and a layer of an n-doped semiconductor material on a second surface of said active region, and first and second partially oxidized layers sandwiching said p-i-n structure therebetween, each of said first and second partially oxidized layers having at least one conducting path formed therein, said conducting paths formed in said first and second partially oxidized layers being arranged in substantially vertically aligned relationship each to the other, thereby forming said confined cross-sectional configuration of said gain channels; and
   (b) means for creating a directed flow of p- and n-type carriers into said active region and confining said carriers therein for establishing a substantial carrier concentration and current density in said active region, thereby contributing to amplification of an optical signal supplied to said optical amplifier.

2. The cavity-less semiconductor optical amplifier of claim 1 wherein said active region is made of GaAs.

3. The cavity-less semiconductor optical amplifier of claim 2 wherein the thickness of said active region is in the order of 1.0–1.2 $\mu$m.

4. The cavity-less semiconductor optical amplifier of claim 1 wherein a semiconductor material of said p-doped and n-doped layers of said p-i-n structure includes AlGaAs.

5. The cavity-less semiconductor optical amplifier of claim 1 wherein said first and second partially oxidized layers are formed of AlAs.

6. The cavity-less semiconductor optical amplifier of claim 1 wherein a diameter of said conducting paths formed in said first and second partially oxidized layers approximates 5 $\mu$m.

7. The cavity-less semiconductor optical amplifier of claim 1 further comprising:
   a top structural arrangement spaced from said first layer of said p-i-n structure through said first partially oxidized layer, said top structural arrangement including:
      a p-doped linearly graded layer formed of p-type semiconductor material disposed in intimate contact with said first partially oxidized layer,
      a cap layer formed of p-type semiconductor material positioned on the top of said p-doped linearly graded layer,
      a first anti-reflection area formed substantially centrally on the top of said cap layer, and
      a first contact surface formed on the top of an cap layer and surrounding said anti-reflection area.

8. The cavity-less semiconductor optical amplifier of claim 7 wherein an input optical signal enters into said optical amplifier through a first anti-reflection area substantially perpendicularly thereto.

9. The cavity-less semiconductor optical amplifier of claim 7 wherein a current supplied to said first contact surface contributes into said directed flow of the carrier into said active region.

10. The cavity-less semiconductor optical amplifier of claim 7 wherein said p-doped linearly graded layer is formed of p-doped AlGaAs with the concentration of Al in said layer gradually changing from substantially 0% at the proximity to boundary with said cap layer to substantially 100% at the proximity to the boundary with said first partially oxidized layer.

11. The cavity-less semiconductor optical amplifier of claim 7 wherein the thickness of said p-doped linearly graded layer is in the order of 0.1 $\mu$m.

12. The cavity-less semiconductor optical amplifier of claim 7 wherein said cap layer is formed of p-doped GaAs.

13. The cavity-less semiconductor optical amplifier of claim 7 wherein the thickness of said cap layer approximates 200 Å.

14. The cavity-less semiconductor optical amplifier of claim 1 further comprising:
   a bottom structural arrangement spaced from said n-doped layer of said p-i-n structure through said second partially oxidized layer, said bottom structural arrangement including:
      a shoulder region layer formed of n-doped semiconductor-material disposed in contact with said second partially oxidized layer,
      an etch-stop layer formed of a semiconductor material positioned on the bottom of said shoulder region layer,
      a n-doped linearly graded layer formed of a n-type semiconductor material positioned on the bottom of said etch-stop layer,
      a substrate supporting said n-doped linearly graded layer thereon,
      an output window having an aperture extending substantially centrally through said n-doped linearly graded layer and said substrate and terminating at the bottom of said etch-stop layer,
      a second anti-reflection area formed at the bottom of said etch-stop layer within a periphery of said output window, and
      a second contact surface formed on the bottom of said substrate around the periphery of said output window.

15. The cavity-less semiconductor optical amplifier of claim 14 wherein said shoulder region layer is formed of n-doped AlGaAs.

16. The cavity-less semiconductor optical amplifier of claim 14 wherein the thickness of said shoulder region layer approximates 0.2 $\mu$m.

17. The cavity-less semiconductor optical amplifier of claim 15 wherein said shoulder region layer is formed of n-doped AlGaAs with approximately 70% concentration of Al.

18. The cavity-less semiconductor optical amplifier of claim 14 wherein said etch-stop layer is formed of AlGaAs with approximately 80% concentration of Al.

19. The cavity-less semiconductor optical amplifier of claim 14 wherein s aid n-doped linearly graded layer is formed of n-doped AlGaAs with the concentration of Al in said layer gradually changing from substantially 0% at the proximity to the boundary with said substrate to substantially 50% at the proximity to the boundary with said etch-stop layer.

20. The cavity-less semiconductor optical amplifier of claim 14 wherein the thickness of said n-doped linearly graded layer is in the order of 0.1 $\mu$m.

21. The cavity-less semiconductor optical amplifier of claim 14 wherein said substrate is formed of n-doped GaAs.

22. The cavity-less semiconductor optical amplifier of claim 14 wherein the thickness of said substrate approximates 150 $\mu$m.

23. The cavity-less semiconductor optical amplifier of claim 14 wherein an output optical signal exits from said optical amplifier through said second anti-reflection area substantially perpendicular thereto.

24. The cavity-less semiconductor optical amplifier of claim 14 wherein a current supplied to said second contact surface contributes into said directed flow of the carriers into said active region.

25. The cavity-less semiconductor optical amplifier of claim 7 wherein said gain channel and said top structural arrangement are formed as a cylindrical mesa surrounded by a dielectric structure, said first contact surface extends beyond said cap layer to cover the top of said dielectric structure.

26. The cavity-less semiconductor optical amplifier of claim 1 based on III–V material systems.

27. The cavity-less semiconductor optical amplifier of claim 1 based on II–VI material systems.

28. The cavity-less semiconductor optical amplifier of claim 1, further including a plurality of said amplifiers arranged in a multidimensional architectural structure.

29. A method of manufacturing a cavity-less semiconductor optical amplifier, comprising the steps of:
   providing a n-GaAs substrate,
   forming on the surface of said substrate, a graded n-doped layer of AlGaAs of 0.1 $\mu$m thickness with concentration of Al gradually changing along the thickness of said linearly graded n-doped layer,
   forming on the top of said linearly graded n-doped layer an etch-stop AlGaAs layer with approximately 80% concentration of Al,
   forming on the top of said etch-stop layer a n-doped AlGaAs shoulder region layer of 0.2 $\mu$m thickness with approximately 70% concentration of Al,
   forming on the top of said n-doped AlGaAs shoulder region layer, a n-doped AlAs layer of 0.1 $\mu$m thickness,
   forming on the top of said n-doped AlAs layer, a n-doped AlGaAs shoulder layer,
   forming a bulk intrinsic GaAs active region of 1.0–1.2 $\mu$m thickness on the top of said n-doped AlGaAs shoulder layer,
   forming a p-doped AlGaAs shoulder layer on the top of said active region,
   forming a p-doped AlAs layer of 0.1 $\mu$m thickness on the top of said p-doped AlGaAs should layer,
   forming on the top of said p-doped AlAs layer a p-doped linearly graded AlGaAs layer of 0.1 $\mu$m thickness with concentration of Al gradually changing there along,
   forming a p-doped GaAs cap layer of 200 Å thickness on the top of said p-doped linearly graded layer,
   etching said layers formed above said n-doped shoulder region layer from the sides, thus forming a cylindrical mesa, and exposing said p-doped and n-doped AlAs layers,
   selectively oxidizing said p-doped and n-doped AlAs layers from the periphery towards the center thereof, thereby defining a current path at each of said p-doped and n-doped AlAs layers,
   etching said substrate and said n-doped linearly graded AlGaAs layer forming an output window below said cylindrical mesa,
   passivating said cylindrical mesa at the sides thereof,
   forming contacts of the top of said cap layer, top of said passivated layer, and on the bottom of said substrate, and
   forming anti-reflection areas on the top of said cap layer and on the bottom of said etch-stop layer.

* * * * *